United States Patent [19]

Saka et al.

[11] Patent Number: 4,623,848
[45] Date of Patent: Nov. 18, 1986

[54] MICROWAVE PREAMPLIFIER

[75] Inventors: Hiroshi Saka, Osaka; Toshihide Tanaka, Ikoma, both of Japan

[73] Assignee: Matsushita Electric Industrial Co., Ltd., Japan

[21] Appl. No.: 631,468

[22] Filed: Jul. 16, 1984

[30] Foreign Application Priority Data

Jul. 19, 1983 [JP] Japan ................................. 58-132422
Jul. 19, 1983 [JP] Japan ................................. 58-132423

[51] Int. Cl.⁴ ............................................. H03F 3/60
[52] U.S. Cl. ..................................... 330/286; 330/277
[58] Field of Search .................. 330/53, 277, 286, 287

[56] References Cited

U.S. PATENT DOCUMENTS 3,710,272 1/1973 Ayaki .................................. 330/286

Primary Examiner—James B. Mullins
Attorney, Agent, or Firm—Lowe, Price, Leblanc, Becker & Shur

[57] ABSTRACT

An input matching circuit for a first stage amplifying element of a microwave preamplifier comprises at least one capacitive open-ended stub which is located in the vicinity of an input terminal of the first stage amplifying element so that the structure of the input matching circuit is simple. Input impedance of the first stage amplifying element is designed to assume a state of impedance matching for minimum noise, while the distance between the first stage amplifying element and a second stage amplifying element is appropriately determined with an input matching circuit of the second stage amplifying element being appropriately set. With this arrangement input VSWR of the preamplifier is set to a value smaller than an input VSWR of the first amplifying stage, and therefore it is possible to provide a microwave preamplifier which shows satisfactory input VSWR characteristic and noise figure such that the input VSWR of the preamplifier is improved when compared with the input VSWR exhibited on impedance matching for minimum noise while the noise figure is less deteriorated compared to the noise figure exhibited on impedance matching for minimum noise.

18 Claims, 14 Drawing Figures

MICROWAVE PREAMPLIFIER

BACKGROUND OF THE INVENTION

This invention relates generally to radio receivers for microwaves and SHF waves, and particularly to preamplifiers for such radio receivers.

With recent advance in noise reduction in connection with GaAs FETs, most advanced GaAs FETs show a noise figure which is less than 1.5 dB at 12 GHz. Following with this noise reduction, GaAs FETs are sometimes used as an amplifying element constituting a preamplifier of a radio receiver of SHF band. However, there have been various problems to be solved in order that GaAs FETs are used as an amplifying element of such a preamplifier. One of the most difficult problems is that the input impedance of a GaAs FET deviates from an impedance matching state when the noise figure of the GaAs FET is minimum, whereas the noise figure shows a minimum value when VSWR is around 3. Using a preamplifier showing large input VSWR for an SHF band receiver, results in a problem of matching between the SHF band receiver and an antenna conneted thereto.

For this reason therefore, measures have hitherto been taken for obtaining desired matching with respect to an antenna by either (1) adding an isolator having a low insertion loss at an input stage of a preamplifier designed to show minimum noise figure or (2) designing the input impedance of a preamplifier to show impedance matching for maximum gain.

However, the above method (1) suffers from a problem that the SHF band receiver would be complex in structure and high in cost because an isolator of extremely low insertion loss is needed. Furthermore, the method (1) suffers from a drawback that the noise figure of the SHF band receiver deteriorates as much as the insertion loss of the isolator. In the method (2), since the preamplifier is designed to show impedance matching for maximum gain, the noise figure of the amplifier greatly deteriorates when compared to a case of impedance matching for minimum noise. Furthermore, the method (2) has a drawback that an input matching circuit would be complex in structure, and the noise figure of the preamplifier would be deteriorated greatly due to the increase in loss of the input signal at the input matching circuit.

SUMMARY OF THE INVENTION

The present invention has been developed in order to remove the above-described drawbacks inherent to the conventional microwave preamplifiers.

It is, therefore, an object of the present invention to provide a new and useful microwave preamplifier having an input impedance, taking impedance matching with an antenna into account, and suffering from low deterioration in noise figure without using an isolator.

According to a feature of the present invention an input matching circuit of a first stage amplifier is formed of capacitive open-ended stubs provided around an input terminal of an amplifying element so that the input matching circuit is simple in construction paying attention to the fact that a preamplifier usually comprises two or three amplifying stages. Furthermore, the input impedance of the first stage amplifier is designed so that the input impedance of the first stage amplifier is close to an impedance matching state for minimum noise, while an input matching circuit of a second stage amplifier is formed of capacitive open-ended stubs provided around an input terminal and of capacitive open-ended stubs provided at a position spaced apart from the input terminal by quarter wavelength so that input VSWR of the second stage amplifier becomes larger and larger as the frequency increases. Moreover, the distance between the amplifying element of the first stage amplifier and the amplifying element of the second stage amplifier is set to a value so that the input VSWR of the first stage amplifier at the time that the first stage amplifier is connected to the second stage amplifier, is smaller than the input VSWR of the same measured in connection with the first stage amplifier itself.

In accordance with the present invention there is provided a microwave preamplifier, comprising: (a) a first stage amplifier having: an input stripline; a first stage amplifying element having an input terminal connected to one end of said input stripline, and an output terminal; an input matching circuit having at least one capacitive open-ended stub positioned within a distance equal to or smaller than $\frac{1}{8}$ wavelength from said input terminal of said first stage amplifying element; an output stripline one end of which is connected to said output terminal of said first stage amplifying element; and an output matching circuit having at least one capacitive open-ended stub positioned within a distance equal to or smaller than half wavelength from said output terminal of said first stage amplifying element; and (b) a second stage amplifier having: a second input stripline; a second stage amplifying element having an input terminal connected to one end of said second input stripline, and an output terminal; and a second input matching circuit having a capacitive open-ended stub positioned within a distance equal to or smaller than $\frac{1}{8}$ wavelength from said input terminal of said second stage amplifying element and a capacitive open-ended stub positioned at a distance substantially equal to half wavelength from said input terminal of said second stage amplifying element; (c) said first stage amplifying element and said second stage amplifying element being spaced apart from each other by a distance given by:

$$(1+5/16)\lambda_h \leq 1 \leq (1+9/16)\lambda_h$$

wherein $\lambda_h$ is the wavelength of the input signal of said preamplifier at a higher range.

In accordance with the present invention there is also provided a microwave preamplifier comprising: a waveguide; a waveguide-to-stripline transition circuit having a metallic conductor inserted into said waveguide; a bolt inserted into said waveguide so that the length of said bolt within said waveguide is adjustable, a tip of said bolt being positioned close to one end of said metallic conductor; an input stripline connected, at its one end, to said other end of said metallic conductor; an input matching circuit connected to said input stripline; and an amplifying element having an input terminal connected to the other end of said input stripline; an electrical length between said input terminal of said amplifying element and an inner surface of said waveguide where said metallic conductor protrudes into said waveguide, being equal to or smaller than half wavelength of said input signal.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings.

DETAILED DESCRIPTION OF THE INVENTION

Figure 1:
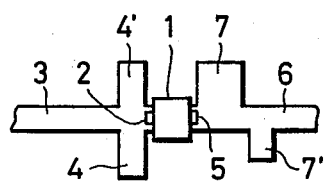
FIG. 1 is a top plan view showing an embodiment of a first stage amplifier of the preamplifer according to the present invention.

Referring now to FIG. 1, a first stage amplifier of the microwave preamplifier according to the present invention is shown. In FIG. 1, an input stripline 3 is connected to a gate of a GaAs FET 1 used as a semiconductor amplifying element, while an input matching circuit having capacitive open-ended stubs 4 and 4' is provided around the gate 2. To a drain 5 of the semiconductor amplifying element 1 is connected an output stripline 6, and an output matching circuit comprising capacitive open-ended stubs 7 and 7' is provided around the drain 5. The electrical length between the open-ended stubs 4 and 4' and the gate 2 is selected to a value which is equal to or smaller than one-eighth wavelength ($\lambda_s/8$) of the center frequency of the input signal to the preamplifier. In addition, the electrical length between the open-ended stubs 7 and 7' and the drain 5 is selected to a value which is equal to or smaller than a half wavelength ($\lambda_s/2$).

Figure 2:
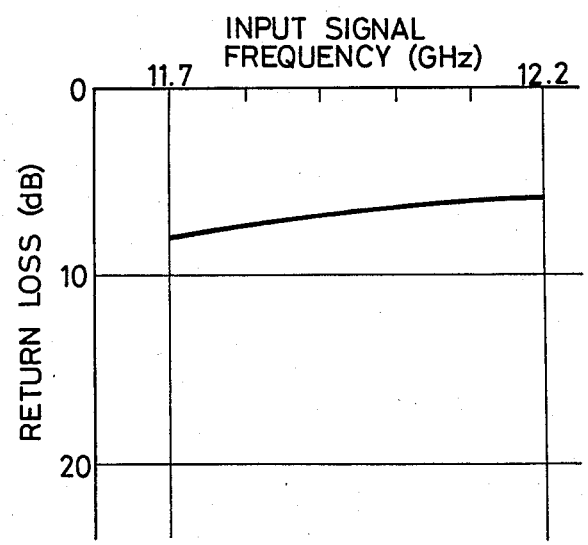
FIG. 2 is a graphical representation of frequency response of return loss of input impedance of the first stage amplifier itself shown in FIG. 1.

FIG. 2 shows a characteristic of return loss of the input impedance of the first stage amplifier itself of FIG. 1. As seen in the graph of FIG. 2, the return loss of the input impedance of the first stage amplifier itself is approximately 8 dB at a frequency 11.7 GHz of a lower range, and approximately 6 dB at a frequency 12.2 GHz of a higher range. This shows that the higher the frequency, the lower the return loss. Namely, the input VSWR increases along with the increase in frequency. The input impedance of the first stage amplifier is set at this time close to the input impedance where impedance matching for minimum noise is obtained.

The output impedance of the first stage amplifier itself is substantially set to a matching state by way of the open-ended stubs 7 and 7'.

Figure 3:
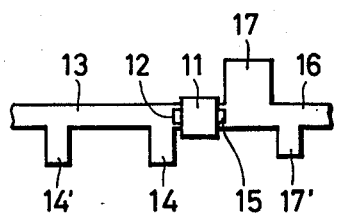
FIG. 3 is a top plan view showing an embodiment of a second stage amplifier of the preamplifer according to the present invention.

FIG. 3 shows only the second stage amplifier of the preamplifier according to the present invention. In FIG. 3, an input stripline 13 is connected to gate 12 of a GaAs FET 11 used as a semiconductor amplifying element, while an input matching circuit having a capacitive open-ended stub 14 provided around the gate 12, and a capacitive open-ended stub 14' positioned at a place spaced from the gate 12 by approximately half wavelength ($\lambda_s/2$) is provided. To a drain 15 of the semiconductor amplifying element 11 is connected an output stripline 16, and an output matching circuit comprising capacitive open-ended stubs 17 and 17' is provided around the drain 15. The electrical length between the open-ended stubs 14 and the gate 12 is selected to a value which is equal to or smaller than ⅛ wavelength ($\lambda_s/8$) of the center frequency of the input signal. In addition, the electrical length between the open-ended stubs 17 and 17' and the drain 15 is selected to a value which is equal to or smaller than a half wavelength ($\lambda_s/2$).

Figure 4:
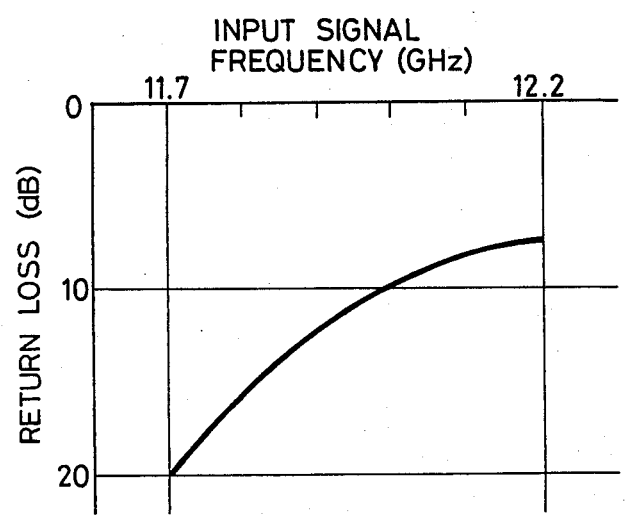
FIG. 4 is a graphical representation of frequency response of return loss of input impedance of the second stage amplifier itself shown in FIG. 3.

FIG. 4 shows a characteristic of return loss of the input impedance of the second stage amplifier itself of FIG. 3. As seen in the graph of FIG. 4, the return loss of the input impedance of the second stage amplifier itself is approximately 20 dB at a frequency 11.7 GHz of a lower range, and approximately 7 dB at a frequency 12.2 GHz of a higher range. This shows that the higher the frequency, the smaller the return loss. Namely, the input VSWR increases along with the increase in frequency. The output impedance of the second stage amplifier itself is substantially set to a matching state by way of the open-ended stubs 17 and 17'.

Figure 5:
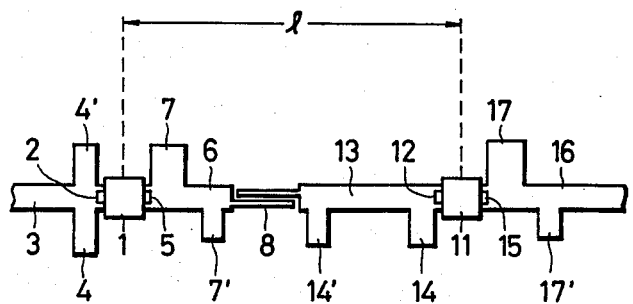
FIG. 5 is a schematic top plan view showing an embodiment of the preamplifer according to the present invention.

FIG. 5 is a top plan view showning an embodiment of an SHF preamplifier having two amplifying stages respectively corresponding to the first stage amplifier of FIG. 1 and the second stage amplifier of FIG. 3. In FIG. 5, the reference 8 is a d.c. blocking circuit having an interdigital coupling line formed of two parallel open-ended striplines coupled with each other which striplines have substantially quarter wavelength ($\lambda_s/4$) of the center frequency of the input signal. The electrical length between the first stage amplifying element 1 and the second stage amplifying element 11 is selected to satisfy the following relationship.

$$(1+5/16)\lambda_h \leq l \leq (1+9/16)\lambda_h$$

wherein $\lambda_h$ is the wavelength of the input signal of the SHF preamplifier at the high range.

Figure 6:
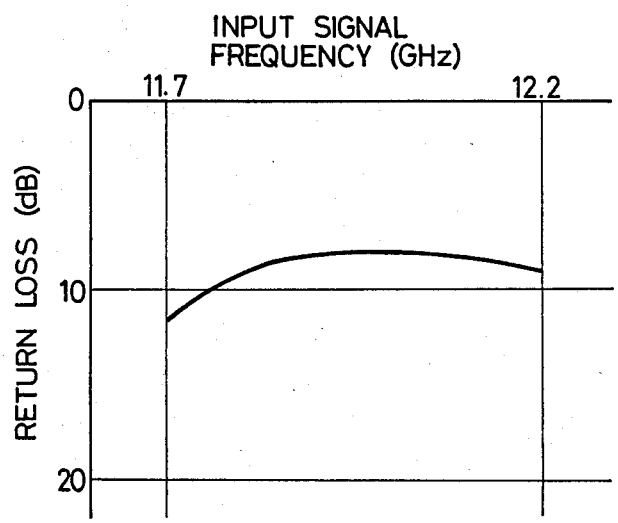
FIG. 6 is a graphical representation of frequency response of return loss of input impedance of the preamplifier shown in FIG. 5.

FIG. 6 shows the chracteristic of return loss of the input impedance of the embodiment shown in FIG. 5. The return loss of the input impedance is approximately 11 dB at 11.7 GHz, 8 dB at 12.0 GHz, and 9 dB at 12.2 GHz. Comparing this characteristic with the return loss of the input impedance of the first stage amplifier itself shown in FIG. 2, the minimum value of the return loss in FIG. 2 is 6 dB at 12.2 GHz whereas the minimum value of the return loss in FIG. 6 is 8 dB at 12.0 GHz.

In the embodiment of FIG. 5, the input matching circuit of the preamplifier is formed of only simple open-ended stubs 4 and 4' while the input matching circuit of the second stage amplifier is formed of only simple open-ended stubs 14 and 14'. Simultaneously, the electrical length l between the first stage amplifying element 1 and the second stage amplifying element 11 is selected so as to satisfy the relationship of $(1+5/16)\lambda_h \leq 1 \leq (1+9/16)\lambda_h$. As a result, the input VSWR of the preamplifier is remarkably improved such that it is smaller than the input VSWR of the first stage amplifier itself. Furthermore, the deterioration in the noise figure due to the improvement in the input VSWR of the preamplifier can be suppressed to a small extent when compared to the deterioration in the noise figure due to the improvement of the input VSWR of the first stage amplifier itself. In the above, when the value of l is out of the above-mentioned range, the improvemnt of VSWR is not remarkable while the return loss remains at a large value as seen in FIG. 2. On the contrary, when the value of l is within the above-mentioned range, the input matching circuit of the preamplifier is simple in construction, and since the first stage amplifying element 1 is formed at a position spaced from the input terminal 2 by a small distance substantially equal to or smaller than one-eighth wavelength ($\lambda_s/8$), deterioration in noise figure of the preamplifer due to insertion less of the input matching circuit can be effectively suppressed to a small extent.

Figure 7A:
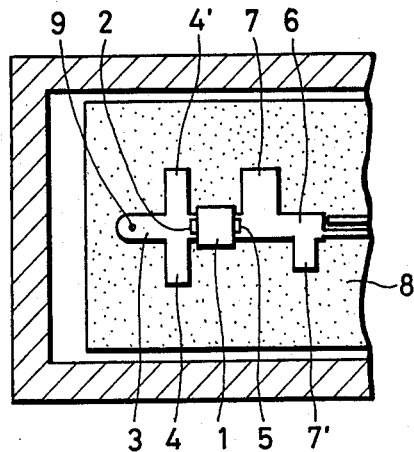
FIGS. 7A and 7B are cross-sectional top plan view and cross-sectional side view of another embodiment of the preamplifier according to the present invention.
Figure 7B:
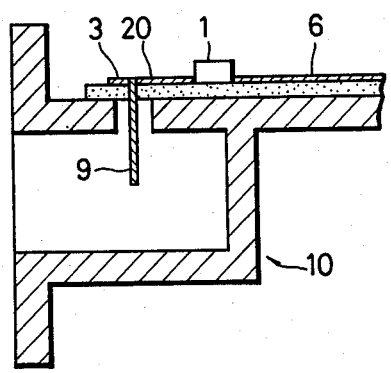

FIGS. 7A and 7B show another embodiment of the present invention, which is a modification of the microwave preamplifier of FIG. 5. More specifically, this embodiment comprises all the elements shown in FIG. 5, and a feature at its signal input portion as will be described hereinafter in detail. In these diagrams, the reference 9 is a metallic conductor whose one end is connected to one end of the input stripline 3 connected to the first stage amplifying element 1, and the other end protrudes inside a waveguide 10 so as to form a waveguide-stripline transition circuit. The distance between gate 2 of the first amplifying element 1 and the metallic conductor 9 is set to a value which is equal to or smaller than half wavelength of the center frequency of the input signal. The reference 20 is a dielectric substrate on which the circuit arrangement of FIG. 5 is provided.

In this embodiment of FIGS. 7A and 7B, since the electrical length of the stripline 3 connected to the gate 2 is selected to a small value which is equal to or smaller than half wavelength of the input signal, and since the input line of the preamplifier is constructed of a waveguide, the deterioration in noise figure of the preamplifier can be remarkably suppressed.

Figure 8A:
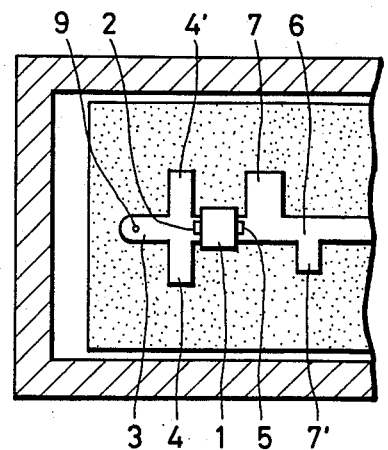
FIGS. 8A and 8B are cross-sectional top plan view and cross-sectional side view of another embodiment of the preamplifier according to the present invention.
Figure 8B:
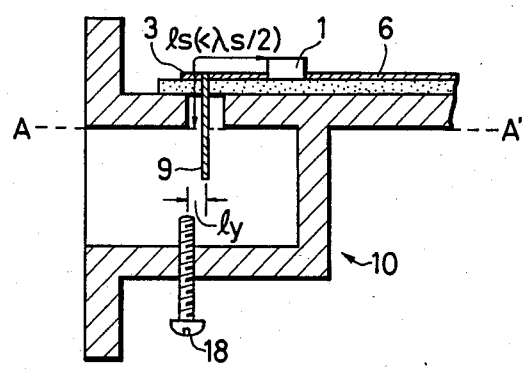

FIGS. 8A and 8B show another embodiment involving impedance adjustment of the preamplifier. Same elements as those in FIGS. 7A and 7B are designated at like references. In FIGS. 8A and 8B, the gate 2 of the semiconductor amplifying element 1 is connected to the input stripline 3, while the input matching circuit formed of capacitive open-ended stubs 4 and 4' is provided around the gate 2. To the drain 5 of the semiconductor amplifying element 1 is connected to the output stripline 6, while the output matching circuit formed of capacitive open-ended stubs 7 and 7' is provided around the drain 5. The reference 9 is a metallic conductor whose one end is connected to the input stripline 3, and the other end is arranged to protrude inside the waveguide 10 so as to form a waveguide-to-stripline transistion circuit.

An electrical length from an inner surface plane A-A' of the waveguide 10 at which the metallic conductor 9 penetrates the wall of the waveguide 10, to the semiconductor amplifying element 1, is selected to a value which is equal to or smaller a half wavelength $\lambda_s/2$. The reference 18 is a bolt which is located in the vicinity of the metallic conductor 9 at a position spaced apart from the metallic conductor 9 by an electrical length $l_y$. This bolt 18 is arranged to be perpendicular to the H-plane of the waveguide 10 and is inserted into the waveguide 10, where the electrical length $l_x$ (not shown) from the bolt 18 to the semiconductor amplifying element 1 is selected to be a value which is equal to or smaller than $\frac{3}{4}$ wavelength of the input signal. This electrical length from the input terminal of the semiconductor amplifying element 1 to the bolt substantially equals the sum of the above-mentioned electrical length $l_y$ and an electrical length between the bolt 1 and the metallic conductor 9.

In this embodiment, the electrical length $l_s$ between the semiconductor element 1 and the waveguide surface plane A-A' is selected to be a value equal to or smaller than half wavelength of the input signal, while the input matching circuit having the open-ended stubs 4 and 4' is provided within an electrical length of the stripline 3 which is shorter than $l_s$. The input matching circuit is used to perform coarse adjustment of input impedance of the preamplifier, while the bolt 18 is provided for performing fine adjustment of the input impedance. Since the electrical length $l_s$ between the input terminal of the semiconductor element 1 and the waveguide surface plane is set to an extremely small value which is equal to or smaller than half wavelength of the input signal, propagation loss of the input signal is extremely small at a stripline portion formed of the input stripline 3 made of a stripline having a large propagation loss, and at a coaxial line portion formed of the metallic conductor 9 and the waveguide 10, thereby deterioration in noise figure of the preamplifer can be effectively prevented. Furthermore, the adjustment of the input impedance of the preamplifier can be carried out by way of the bolt 18 continuously and repeatedly, while fine adjustment is readily performed.

The improvements in VSWR will be understood from the following results of experiments. In a GaAs FET preamplifier of an in-band frequency of 11.7 to 12.2 GHz, when the electrical length $l_s$ is selected to be a value approximately $\frac{3}{8}$ times the wavelength of the input signal, and the electrical length $l_y$ is set to zero for instance, the input VSWR, which was 2.6 before the bolt 18 is inserted, is improved to 1.9 at the higher range within the in-band frequencies although the variation in input impedance of the GaAs FET preamplifier at the lower range of the in-band frequencies is small. In the case that the bolt 18 is inserted with the electrical length $l_y$ being selected to a value which is approximately $\frac{1}{8}$ wavelength, the input VSWR of the GaAs FET preamplifier, which was 2.4 before the bolt 18 is inserted, is improved to 2.0 at the lower range within the in-band frequencies although the input impedance of the GaAs FET preamplifier at high range of the in-band frequencies hardly changes (the phase arg $S_{11}$ of the input S parameter $S_{11}$ rotates clockwise.).

Figure 9A:
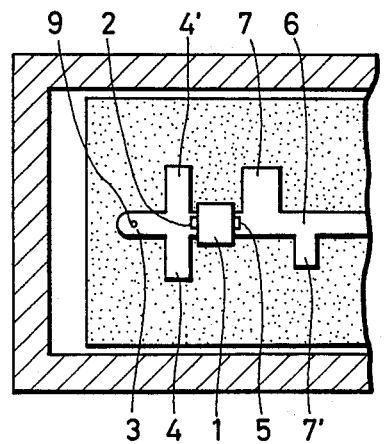
FIGS. 9A and 9B are cross-sectional top plan view and cross-sectional side view of another embodiment of the preamplifier according to the present invention.
Figure 9B:
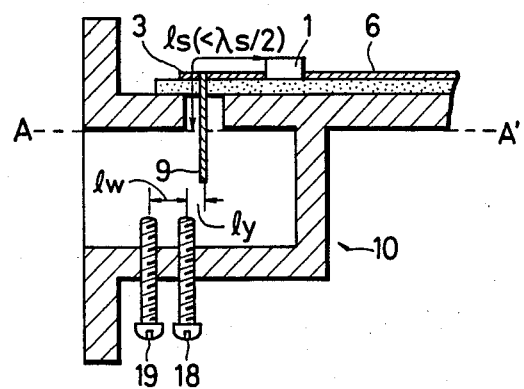

FIGS. 9A and 9B show another embodiment of the present invention. This embodiment differs from the above-described embodiment of FIGS. 8A and 8B in that two bolts 18 and 19 are employed to be inseted into the waveguide 10 in a direction perpendicular to the H-plane of the waveguide 10. The first bolt 18 is provided in the vicinity of the metallic conductor 9 at a position spaced apart from the matallic conductor 9 by an electrical length $l_y$, while the second bolt 19 is located at a position spaced apart from the first bolt 18 by an electrical length $l_w$. An electrical length $l_z$ between the input terminal of the semiconductor amplifying element 1 and the bolt 19 is selected to approximately half wavelength. Remaining components of the embodiment of FIGS. 9A and 9B are the same as those in the embodiment of FIGS. 8a and 8B.

While the embodiment of FIGS. 9A and 9B operates in a similar manner to the embodiment of FIGS. 8A and 8B, because of the provision of the two bolts 18 and 19 the adjusting range of the input impedance of the preamplifier is wider than that in the embodiment having a single bolt. The improvements in VSWR will be understood from the following results of experiments. In a GaAs FET preamplifier of an in-band frequencies of 11.7 to 12.2 GHz having the structure of FIGS. 9A and 9B, let us assume that the electrical length $l_s$ is selected to be a value approximately ⅜ times the wavelength of the input signal, the electrical length $l_y$ is set to zero, and the electrical length $l_w$ indicating the position of the bolt 19 is selected to be to approximately ⅛ wavelength. Under this condition, if only the bolt 18 is inserted into the waveguide 10, the input VSWR, which has been 2.6 before the bolt 18 is inserted, is improved to 1.9 at the higher range within the in-band frequencies although the variation in input impedance of the GaAs FET preamplifier at the lower range of the in-band frequencies is small. On the other hand, if only the second bolt 19 is inserted into the waveguide 10, the input VSWR of the GaAs FET preamplifier, which was 2.4 before the second bolt 19 is inserted, is improved to 2.0 at the low range within the in-band frequencies although the input impedance of the GaAs FET preamplifier at the higher range of the in-band frequencies hardly changes (the phase arg $S_{11}$ of the input S parameter $S_{11}$ rotates clockwise.). When both the bolts 18 and 19 are simultaneously inserted into the waveguide 10, the maximum value of the input VSWR of the GaAS FET preamplifier at the in-band frequencies, which VSWR was 2.6 before these bolts 18 and 19 are inserted, is improved to 2.0 after insertion.

Figure 10A:
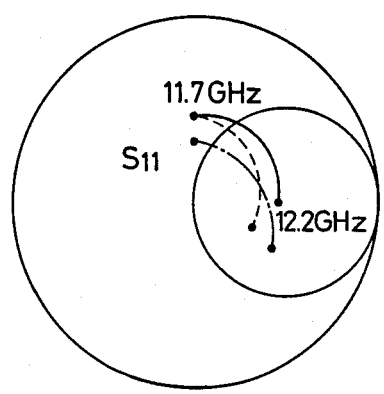
FIGS. 10A and 10B are Smith charts showing the variation in input S parameter before and after the preamplifier of FIG. 9.
Figure 10B:
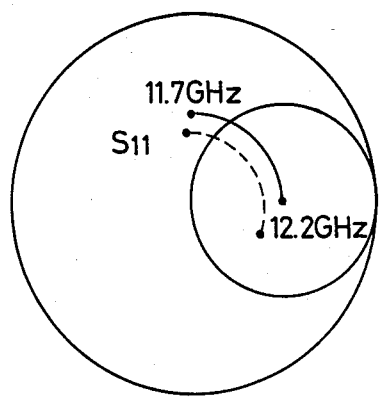

FIGS. 10A and 10B are Smith charts showing the state of variation of the input S parameter of the preamplifier, which is obtained by the adjustment of the bolts 18 and 19 in the embodiment of FIGS. 9A and 9B. When the electrical length $l_s$ is selected to approximately ⅜ wavelength of the input signal, the electrical length $l_y$ to zero, and the electrical length $l_w$ to approximately ⅛ wavelength, the frequency response before adjustment indicated at solid curves is now changed to the characteristic indicated by broken curves of FIG. 10A when only the bolt 18 is inserted into the waveguide 10 and its longitudinal position is adjusted. On the other hand, when only the bolt 19 is inserted into the waveguide 10 and its longitudinal position is adjusted, a frequency response indicated by a dot-dash curve of FIG. 10A is obtained. In the case that both the bolts 18 and 19 are inserted into the waveguide 10 and are adjusted, then a frequency response shown by a broken curve in FIG. 10B is obtained.

As described in the above, according to the present invention, since the structure of the input matching circuit of the first stage amplifier is extremely simple, the preamplifier suffers from small loss of input signal due to the input matching circuit. As a result, it is possible to provide a small-sized preamplifier circuit arrangement while the deterioration in the noise figure of the preamplifier is low. In addition, the input VSWR of the preamplifier can be made smaller than the input VSWR of the first stage amplifier itself, while the deterioration in noise figure due to the improvement in the input VSWR of the preamplifier is small. Moreover, by setting the stripline length of the first stage amplifier to a value equal to or smaller than half wavelength, by connecting the input stripline of the first stage amplifier to the waveguide-to-stripline transition circuit, and by arranging the longitudinal length of the bolt or bolts within the waveguide to be variable where the bolt or bolts are located at appropriate position(s) along the longitudinal direction of the waveguide, it is now possible to adjust the input impedance of the preamplifier continuously and repeatedly. Furthermore, fine adjustment can be performed by way of the bolt or bolts 18 and 19. Because of the adjustment of the input impedance, the adjustment of the noise figure of the preamplifier is also simultaneously effected, while scattering in the input impedance throughout preamplifiers due to scattering in S parameter of the amplifying elements used therefor can also be improved.

The above-described embodiments are just examples of the present invention, and therefore, it will be apparent for those skilled in the art that many modifications and variations may be made without departing from the spirit of the present invention.

What is claimed is:

1. A microwave preamplifier, comprising:
   (a) a first stage amplifier having:
      an input stripline;
      a first stage amplifying element having an input terminal connected to one end of said input stripline, and an output terminal;
      an input matching circuit having at least one capacitive open-ended stub positioned within a distance equal to or smaller than ⅛ wavelength from said input terminal of said first stage amplifying element;
      an output stripline one end of which is connected to said output terminal of said first stage amplifying element; and
      an output matching circuit having at least one capacitive open-ended stub positioned within a distance equal to or smaller than half wavelength from said output terminal of said first stage amplifying element; and
   (b) a second stage amplifier having:
      a second input stripline;
      a second stage amplifying element having an input terminal connected to one end of said second input stripline, and an output terminal; and
      a second input matching circuit having a capacitive open-ended stub positioned within a distance equal to or smaller than ⅛ wavelength from said input terminal of said second stage amplifying element and a capacitive open-ended stub positioned at a distance substantially equal to half wavelength from said input terminal of said second stage amplifying element;
   (c) said first stage amplifying element and said second stage amplifying element being spaced apart from each other by a distance l given by:

$(1+5/16)\lambda_h \leq l \leq (1+9/16)\lambda_h$ wherein $\lambda_h$ is the wavelength of the input signal of said preamplifier at a higher range.

2. A microwave preamplifier as claimed in claim 1, further comprising a waveguide and a waveguide-to-stripline transition circuit connected, at its one end, to the other end of said input stripline of said first stage amplifier, said waveguide-to-stripline transition circuit being inserted into said waveguide, said input stripline of said first stage amplifier having an electrical length which is equal to or smaller than half wavelength of the center frequency of said input signal.

3. A microwave preamplifier as claimed in claim 2, further comprising a bolt inserted into said waveguide, said bolt being located at a position so that an electrical distance between said bolt and the input terminal of said first stage amplifying element substantially equals half a wavelength of the center frequency of said input signal.

4. A microwave preamplifier as claimed in claim 2, further comprising:
(a) a first bolt inserted into said waveguide, said first bolt being located at a position so that an electrical length between said bolt and the input terminal of said first stage amplifying element substantially equals half wavelength of the center frequency of said input signal; and
(b) a second bolt inserted into said waveguide, said second bolt being located at a position so that an electrical length between said second bolt and the input terminal of said first stage amplifying element substantially equals ⅜ wavelength of the center frequency of said input signal.

5. A microwave preamplifier as claimed in claim 2, further comprising a bolt inserted into said waveguide, said bolt being located at a position so that an electrical distance between said bolt and the input terminal of said first stage amplifying element substantially equals ⅜ of a wavelength of the center frequency of said input signal.

6. A microwave preamplifier as claimed in claim 1, further comprising a bolt located at a position so that an electrical distance between said bolt and the input terminal of said first stage amplifying element substantially equals half a wavelength of the center frequency of said input signal.

7. A microwave preamplifier as claimed in claim 1, further comprising a bolt located at a position so that an electrical distance between said bolt and the input terminal of said first stage amplifying element substantially equals ⅜ of a wavelength of the center frequency of said input signal.

8. A microwave preamplifier as claimed in claim 1, further comprising:
(a) a first bolt located at a position so that an electrical length between said bolt and the input terminal of said first stage amplifying element substantially equals half wavelength of the center frequency of said input signal; and
(b) a second bolt located at a position so that an electrical length between said second bolt and the input terminal of said first stage amplifying element substantially equals ⅜ wavelength of the center frequency of said input signal.

9. A microwave preamplifier comprising:
(a) a waveguide;
(b) a waveguide-to-stripline transition circuit having a metallic conductor inserted into said waveguide;
(c) a bolt inserted into said waveguide so that the length of said bolt within said waveguide is adjustable, a tip of said bolt being positioned close to one end of said metallic conductor;
(d) an input stripline connected, at its one end, to said other end of said metallic conductor;
(e) an input matching circuit connected to said input stripline; and
(f) an amplifying element having an input terminal connected to the other end of said input stripline;
(g) an electrical length between said input terminal of said amplifying element and an inner surface of said waveguide where said metallic conductor protrudes into said waveguides, being equal to or smaller than half wavelength of said input signal.

10. A microwave preamplifier as claimed in claim 9, wherein an electrical length from said bolt to said input terminal of said amplifying element is seletected to a value substantially equal to ⅜ wavelength.

11. A microwave preamplifier as claimed in claim 9, wherein an electrical length from said bolt to said input terminal of said amplifying element is selected to a value substantially equal to half wavelength.

12. A microwave preamplifier as claimed in claim 9, further comprising another bolt inserted into said waveguide, an electrical length from said first-mentioned bolt to said input terminal of said amplifying element being selected to a value substantially equal to half wavelengthde, an electrical length from said another bolt to said input terminal of said amplifying element being selected to a value substantially equal to ⅜ wavelength.

13. In a multistage microwave preamplifier having at least a first amplifier stage and a second amplifier stage, the improvement comprising
(a) means for reducing an input VSWR to the multistage preamplifier to a value lower than an input VSWR to the first amplifier alone,
(b) first impedance matching means for substantially matching an input impedance of the first amplifier stage to an antenna and providing a return loss having a slight decrease with frequency throughout an operating frequency band,
(c) second impedance matching means for the second amplifier stage, structured differently from said first impedance matching means for providing a return loss for the second amplifier stage alone decreasing substantially with frequency, thereby providing an input return loss characteristic to the combined first and second amplifier stages having a minimum at a central portion of the operating frequency band and having values substantially greater than the return loss for the first amplifier stage alone throughout the operating frequency band.

14. An improved multistage microwave preamplifier as recited in claim 13 wherein said first amplifier stage comprises:
an input stripline;
a first stage amplifying element having an input terminal connected to one end of said input stripline, and an output terminal;
an output stripline one end of which is connected to said output terminal of said first stage amplifying element; and
an output matching circuit having at least one capacitive open-ended stub positioned within a distance equal to or smaller than half wavelength from said output terminal of said first stage amplifying element;
wherein said first impedance matching means comprises at least one capacitive open-ended stub positioned within a distance equal to or smaller than ⅛ wavelength from said input terminal of said first stage amplifying element;
said second amplifier stage comprises:
a second input stripline;

a second stage amplifying element having an input terminal connected to one end of said second input stripline, and an output terminal; and said second impedance matching means comprises:

a second input matching circuit having a capacitive open-ended stub positioned within a distance equal to or smaller than ⅛ wavelength from said input terminal of said second amplifying element and a capacitive open-ended stub positioned at a distance substantially equal to half wavelength from said input terminal of said second stage amplifying element;

said first stage amplifying element and said second stage amplifying element being spaced apart from each other by a distance l given by:

$$(1+5/16)\lambda_h \leq l \leq (1+9/16)\lambda_h$$

wherein $\lambda_h$ is the wavelength of the input signal of said preamplifier at a higher range.

15. An improved multistage microwave preamplifier as recited in claim 13 wherein said first amplifier stage comprises:

an input stripline;

a first stage amplifying element having an input terminal connected to one end of said input stripline, a waveguide and a waveguide-to-stripline transistion circuit connected, at its one end, to the other end of said input stripline of said first amplifier stage, said waveguide-stripline transition circuit being inserted into said waveguide, said input stripline of said first amplifier stage having an electrical length which is equal to or smaller than half wavelength of the center frequency of said input signal.

16. An improved multistage microwave preamplifier as recited in claim 13 wherein said first amplifier stage comprises:

an input stripline;

a first stage amplifying element having an input terminal connected to one end of said input stripline, a bolt located at a position so that an electrical distance between said bolt and the input terminal of said first stage amplifying element substantially equals half a wavelength of the center frequency of said input signal.

17. an improved multistage microwave preamplifier as recited in claim 13 wherein said first amplifier stage comprises:

an input stripline;

a first stage amplifying element having an input terminal connected to one end of said input stripline, a bolt located at a position so that an electrical distance between said bolt and the input terminal of said first stage amplifying element substantially equals ⅜ of a wavelength of the center frequency of said input signal.

18. An improved multistage microwave preamplifier as recited in claim 13 wherein said first amplifier stage comprises:

an input stripline;

a first stage amplifying element having an input terminal connected to one end of said input stripline, (a) a first bolt located at a position so that an electrical length between said bolt and the input terminal of said first stage amplifying element substantially equals half wavelength of the center frequency of said input signal; and (b) a second bolt located at a position so that an electrical length between said second bolt and the input terminal of said first stage amplifying element substantially equals ⅜ wavelength of the center frequency of said input signal.

* * * * *